United States Patent [19]

Nuckolls et al.

[11] Patent Number: 5,742,650
[45] Date of Patent: Apr. 21, 1998

[54] POWER REDUCTION METHOD AND APPARATUS FOR PHASE-LOCKED LOOP BASED CLOCKS IN A DATA PROCESSING SYSTEM

[75] Inventors: Charles E. Nuckolls; James R. Lundberg, both of Austin, Tex.

[73] Assignee: Motorola, Inc., Schaumburg, Ill.

[21] Appl. No.: 654,465

[22] Filed: May 28, 1996

Related U.S. Application Data

[63] Continuation of Ser. No. 191,902, Feb. 4, 1994, abandoned.
[51] Int. Cl.$^6$ .................. H04L 25/34; H04L 25/49; H04B 1/06; H04B 1/16
[52] U.S. Cl. .................. 375/376; 375/373; 455/260; 455/343
[58] Field of Search .................. 375/371, 373, 375/376, 356; 326/93, 96; 327/105, 141, 144, 147, 153; 455/127, 343, 259, 260

[56] References Cited

U.S. PATENT DOCUMENTS

| | | |
|---|---|---|
| 4,841,551 | 6/1989 | Avaneas .................. 375/371 |
| 5,103,192 | 4/1992 | Sekine .................. 455/343 |
| 5,307,381 | 4/1994 | Ahuja .................. 375/376 |
| 5,371,764 | 12/1994 | Gillingham .................. 375/376 |
| 5,394,443 | 2/1995 | Byers .................. 375/371 |
| 5,544,203 | 8/1996 | Casasanta .................. 375/376 |

*Primary Examiner*—Curtis Kuntz
*Assistant Examiner*—Vijay Shankar

[57] ABSTRACT

A method and apparatus for reducing power associated with acquiring phase-lock between a reference clock signal and an internal clock signal after each exit from a quiescent state by a data processing system. A phase-locked loop (PLL) phase-locks the internal clock signal to the reference clock signal. A set of clock drivers receive an oscillator signal from the PLL and generate a plurality of multi-phase internal clock signals in response thereto. The clock state machine receives a first control signal from the PLL, indicating that the phase-locked loop is re-acquiring phase-lock as a result of the data processing system leaving a quiescent state. The clock state machine suppresses a set of clock state signals to prevent the clock drivers from changing state during the period of time when the phase-locked loop is re-acquiring phase-lock. The invention reduces power consumption associated with acquiring phase-lock by eliminating the power resulting from toggling the clock drivers during each exit from the quiescent state by the data processing system.

12 Claims, 2 Drawing Sheets

POWER REDUCTION METHOD AND APPARATUS FOR PHASE-LOCKED LOOP BASED CLOCKS IN A DATA PROCESSING SYSTEM

This is a continuation of application Ser. No. 08/191,902, filed Feb. 4, 1994, now abandoned.

FIELD OF THE INVENTION

The present invention relates generally to power reduction in microprocessors, and more particularly to power reduction in microprocessors having phase-locked loop based clocks.

BACKGROUND OF THE INVENTION

As low power applications for microprocessors proliferate, techniques for on-chip power reduction are required. Accordingly, it is desirable to incorporate certain power management techniques, which will reduce power and extend the battery life of a portable computer, into microprocessor design. One such power management technique entails turning off the clocks of the microprocessor while statically maintaining the machine state. This state is commonly referred to as low power stop (LPSTOP). In this state, the microprocessor is completely quiescent, and uses no power. Typically, microprocessors utilizes a phase-locked loop (PLL) that generates a multiple of a reference clock signal to supply on-chip clocks. Thus, before the microprocessors can leave the quiescent state (i.e. LPSTOP), it must re-acquire phase lock.

In the prior art, during the phase-locking interval, the on-chip clocks are running but the presence of a RESET signal prevents instruction processing. Generally, the on-chip clock loading is very heavy and the clock distribution is extensive. Consequently, the power required to run the clocks ($CV^2F$) is significant. A similar problem is present during power-up when the clocks are also running. Some applications employ power supply cycling to reduce power; however, if the clocks are running, the power supply cycling represents an unnecessary power loss. For portable applications or power-critical applications, it is apparent that there is a need to eliminate this power consumption.

In addition, many microprocessors use a PLL to generate clocks at a multiple of the reference clock frequency and others generate multiphase clocks to the reference clock frequency. In both cases, the PLL oscillator runs at a multiple of the reference frequency. Sequential phase/frequency detectors require that the reference frequency match the target frequency, therefore, a divide of the oscillator (or internal clock) must be done. For a phase comparison of equal frequencies, the maximum phase error is 180 degrees. A phase error of this magnitude imposes unnecessary penalties on the speed of phase acquisition (i.e., phase alignment must be acquired from farther away). It also imposes unnecessary constraints on gain during phase acquisition; for instance, if the maximum phase error is reduced, gain can be increased without severe phase overshoot or PLL instability. Increasing the phase pain results in faster phase lock. Since the frequency of using a power-saving quiescent state (such as LPSTOP) is dependent upon the speed of phase lock, a longer phase-lock interval adversely impacts power consumption. A similar problem is present during power-up where clocks are also running. Some applications use power-supply cycling to reduce power; so if the clocks are running, it represents unnecessary power loss. It is, therefore, desirable to reduce the maximum magnitude of phase error.

SUMMARY OF THE INVENTION

The present invention provides a method and apparatus for reducing power associated with acquiring phase-lock between a reference clock signal, provided by an external source, and an internal clock signal after each exit from a quiescent state by a data processing system. The data processing system has a phase-locked loop for phase-locking the internal clock signal to the reference clock signal. The apparatus includes a predetermined number of clock drivers and a clock state machine. The predetermined number of clock drivers receive an oscillator signal from the phase-lock loop and generate a plurality of multi-phase internal clock signal in response thereto. The clock state machine is coupled to the clock drivers and receives a first control signal from the phase-lock loop, indicating that the phase-locked loop is re-acquiring phase-lock as a result of the data processing system leaving the quiescent state. In response to receiving the first control signal, the clock state machine suppresses a clock state enable signal to prevent the clock drivers from changing state, during a period of time when the phase-locked loop is re-acquiring phase-lock. The apparatus reduces power consumption associated with acquiring phase-lock by eliminating the power resulting from toggling the clock drivers during each exit from the quiescent state by the data processor. A reduction in power consumption being proportional to a frequency of use of the quiescent state by the data processor.

DETAILED DESCRIPTION OF A PREFERRED EMBODIMENT

Figure 1:
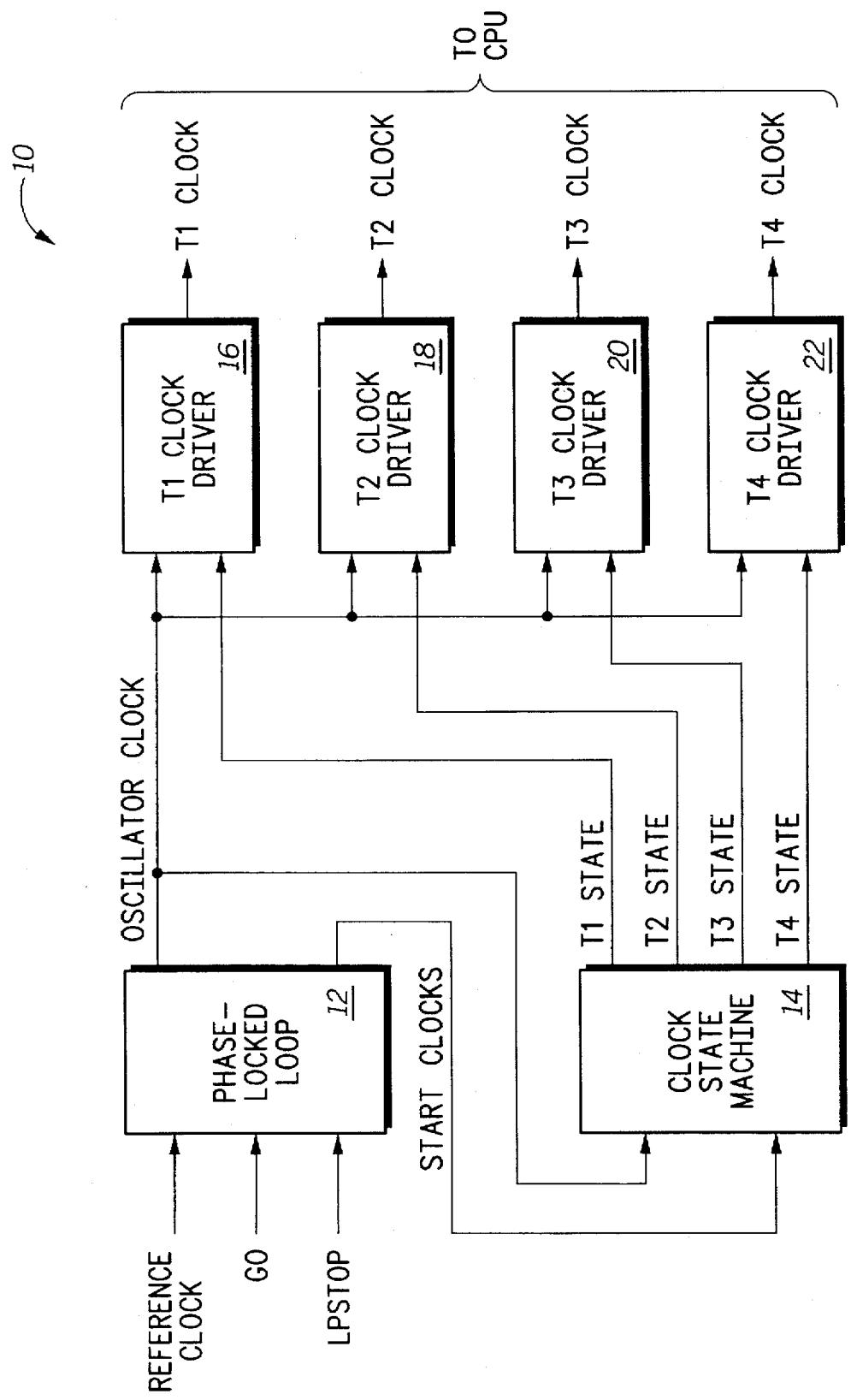
FIG. 1 illustrates in block diagram form a data processing system having a power reduction mechanism in accordance with a preferred embodiment of the present invention.

The present invention can be more fully described with reference to FIGS. 1-2. FIG. 1 illustrates a power reduction mechanism 10 using a phase locked loop 12, a clock state machine 14, and a set of clock drivers 16, 18, 20 and 22. In the preferred embodiment, data processing system 10 uses quadrature clocks, T1, T2, T3, and T4, which are driven from clock drivers 16, 18, 20, and 22, respectively, where the rising T3 clock is phase-aligned with the rising reference clock. The clock state machine 12 is initialized with the T2 clock high and the remaining T-clocks low. In accordance with the preferred embodiment, a digitally-controlled oscillator (not shown), as disclosed in a patent application entitled "A Delay Element with Digitally Controllable Gain" Ser. No. 07/993,757, by Lundberg et al. filed on Dec. 21, 1992 and assigned to the assignee hereof, is modulated within PLL 12 to generate a clock signal, OSCILLATOR CLOCK, at a frequency of 4× the reference clock. Each rising edge of the OSCILLATOR CLOCK signal defines one of four rising T-clock edges and one of four falling T-clock edges. However, instead of using T3 to lock to the reference clock, a buffered version of OSCILLATOR CLOCK is used. When the quadrature clocks are running, on the falling edge of the buffered version of the OSCILLATOR CLOCK signal, the clock state machine 14 generates a new state to Clock Drivers 16, 18, 20, 22. On the rising edge of the buffered version of the OSCILLATOR CLOCK signal, the clock drivers 16, 18, 20, 22 drive their respective T-clock signals. Thus, the OSCILLATOR CLOCK signal is phase-aligned with each of the T-clock signals.

In the preferred embodiment, the data processor enters a quiescent state (where the clock drivers and the PLL 12 are turned off) during lulls in processing demand. These lulls in processing demand occur, for instance, when the data processor is waiting for data to be returned from memory or input device (not shown). This attribute is important in portable applications for power management. Each time the data processor leaves this quiescent state, the PLL 12 must re-acquire phase-lock to ensure the proper operation of all on-chip synchronous circuitry. Commonly, during normal operation of the data processing system 10 the PLL 12 functions to re-acquire phase hundreds of times a second. During phase acquisition, the PLL 12 disables the clock state machine 14 by de-asserting the START CLOCKS signal. This ensures that prior to and during phase acquisition, the clock drivers 16, 18, 20, 22 are not transitioning with the OSCILLATOR CLOCK signal. Consequently, prior to the completion of phase acquisition, there is no unwarranted power consumption due to the operation of clock drivers (e.g. capacitive loading) or the transitioning of logic being driven by the clock drivers. When phase acquisition is complete, the clock state machine 14 is enabled via the assertion by the PLL 12 of the START CLOCKS signal synchronous to the reference clock signal. Thus, in the present invention the clock drivers 16, 18, 20, 22 are not allowed to transition for a significant amount of time, thereby greatly reducing the total power consumption of the data processing system 10.

In the preferred embodiment of the present invention, frequency-lock is acquired prior to phase acquisition. Thus, since OSCILLATOR CLOCK (4 times the reference clock frequency) is used for phase comparison, the maximum phase error is 180 degrees/4 or 45 degrees. With a reduced maximum phase error, the PLL 12 gain (a parameter related to the rate at which phase error is reduced) can be increased without fear of significant overshoot, further reducing the phase-lock time penalty. Therefore, the frequency of using LPSTOP can be increased for additional power-consumption savings.

Figure 2:
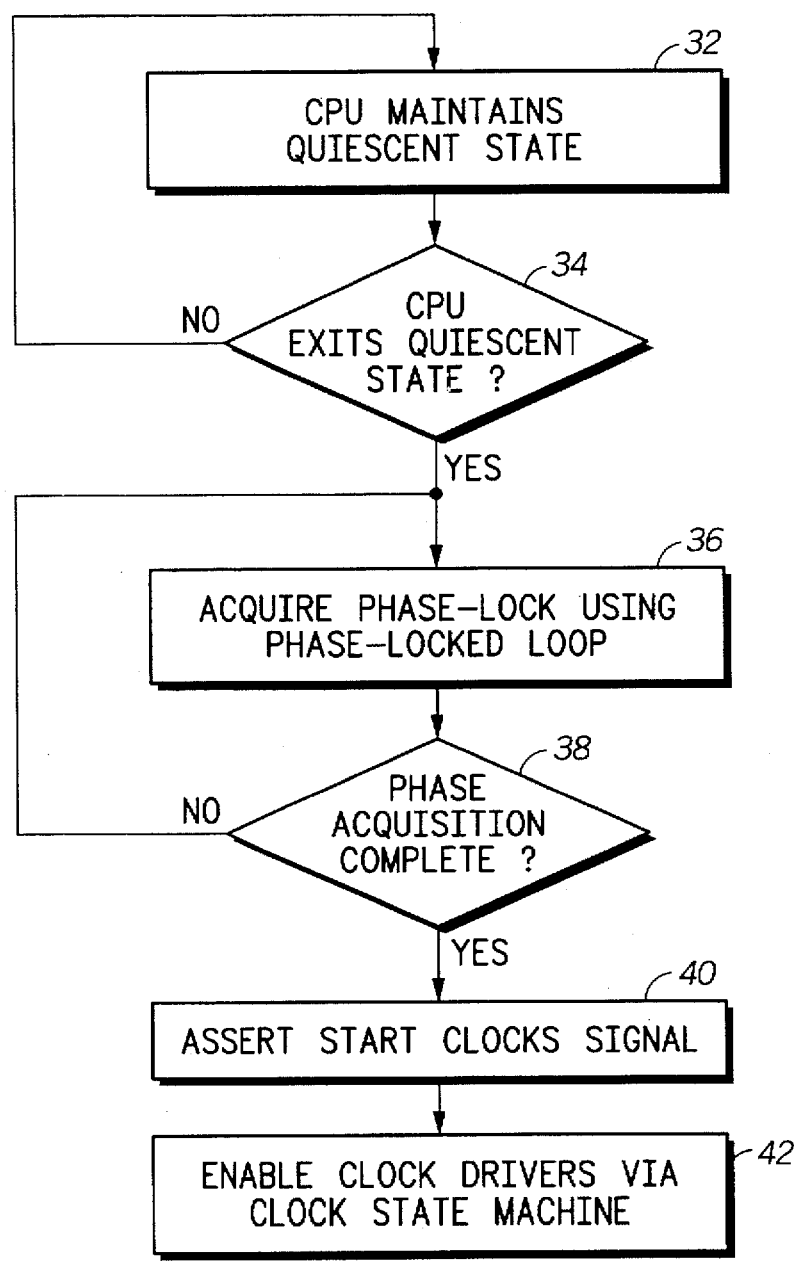
FIG. 2 illustrates a flow diagram for implementing power reduction, using the power reduction mechanism of FIG. 1, in accordance with the present invention.

Illustrated in FIG. 2 is a flow diagram 30 for reducing the power associated with acquiring phase lock using the PLL 12, in accordance with the present invention. At step 32, the data processing system has entered a quiescent state. Several mechanisms exist to force the data processing system to exit the quiescent state 32. At step 34, if a triggering mechanism (e.g. valid interrupt level, reset, timer event) occurs the data processing system 10 will respond by exiting the quiescent state. At step 36, the data processing system 10 acquires phase lock, utilizing PLL 12. However, as previously indicated, clock signals are distributed to the remaining circuitry within the data processing system 10 (during the interval of time when PLL 12 acquires phase lock), but do not transition with the oscillator clock signal. At step 38, the PLL 12 queries whether phase acquisition is complete. If phase acquisition is not complete, the PLL 12 will continue the phase-lock acquisition process, at step 36, until phase-lock is acquired. When phase acquisition is complete, the PLL 12 will assert the START CLOCKS signal, at step 40. The assertion of the START CLOCKS signal, enables the clock state machine 14 to change the T1–T4 state control signals provided to the clock drivers 16, 18, 20, and 22, at step 42. Consequently, the quadrature T-clocks distributed to the data processing system 10 will transition with the OSCILLATOR CLOCK signal.

Thus, the present invention provides a method for reducing the power associated with acquiring phase-lock, between a reference clock signal and an internal clock signal provided by a clock generator, during each exit from a quiescent state or reset by a data processor. This invention is not limited to the preferred embodiment described above. Any data processing system incorporating a PLL to generate clocks at a multiple of the reference clock frequency or generate multiphase clocks to the reference clock frequency could realize power savings and reduced phase acquisition time by practicing this invention. Accordingly, it is intended by the appended claims to cover all modifications of the invention which fall within the true spirit and scope of the invention.

We claim:

1. In a data processing system, including an internal clock generator for receiving an oscillator clock signal from a phase-locked loop (PLL), wherein said internal clock generator comprises a clock state machine and a predetermined number of clock drivers, a method for reducing power associated with acquiring phase-lock between a reference clock signal and an oscillator clock signal provided by said internal clock generator on or during each exit from a quiescent state, said method comprising the steps of:

generating, via said predetermined number of clock drivers, a set of internal clock signals phase-aligned with said oscillator clock signal, said set of internal clock signals being distributed to logic within the data processing system;

receiving, via said clock state machine, a first control signal from said PLL indicating that said PLL is re-acquiring phase-lock as a result of said data processing system entering and leaving said quiescent state; and suppressing, via said clock state machine, a clock state enable signal, in response to receiving said first control signal from said PLL, to prevent said predetermined number of clock drivers from transitioning with said oscillator clock signal and to ensure that said set of internal clock signals do not change states until said PLL acquires phase-lock, suppression of said clock state enable signal reducing power consumption in said data processing system by eliminating the power associated with operation of the predetermined number of clock drivers and transitioning of logic being driven by said predetermined number of clock drivers, prior to and during acquisition of phase-lock.

2. The method of claim 1 further comprising the steps of:

asserting, via said PLL, said first control signal, synchronous to said reference clock signal, after said PLL has re-acquired phase-lock, to indicate that said clock state machine may commence generation of a set of clock state signals; and enabling said clock state machine to generate a new clock state enable signal for each of said predetermined number of clock drivers, in response to assertion by said PLL of said first control signal, said new clock state enable signal allowing said predetermined number of clock drivers to transition their respective internal clock signals with said oscillator clock.

3. The method of claim 2 wherein said step of asserting, via said PLL, said first control signal to indicate that said clock state machine may commence generation of said set of clock state signals enables said predetermined number of clock drivers to generate said set of internal clock signals synchronous to the reference clock signal, in response to generation of said set of clock state signals.

4. The method of claim 2 wherein said step of enabling, via said clock state machine, said predetermined number of clock drivers allows said clock generator to distribute said set of internal clock signal to said data processing system only if phase acquisition is complete.

5. In a data processing system, including an internal clock generator for receiving an oscillator signal from a phase-locked loop (PLL), wherein said internal clock generator comprises a clock state machine and a predetermined number of clock drivers, a method for reducing power associated with acquiring phase-lock between a reference clock signal and an internal clock signal provided by said internal clock generator on or during each exit from a quiescent state by said data processing system, said method comprising the steps of:

generating, via said predetermined number of clock drivers, a set of internal clock signals phase-aligned with said oscillator clock signal, when a first control signal provided by said PLL indicates phase-lock is complete, said internal clock signals being distributed to logic within the data processing system;

receiving, via said clock state machine, said first control signal from said PLL indicating that said PLL is re-acquiring phase-lock as a result of said data processing system entering and leaving said quiescent state; and suppressing, via said clock state machine, a clock state enable signal, in response to said clock state machine receiving said first control signal from said PLL, suppression of said clock state enable signal preventing said predetermined number of clock drivers from transitioning their respective internal clock signals being distributed to logic within the data processing system synchronously with said oscillator clock signal, during a period of time when said PLL is re-acquiring phase-lock, and reducing power consumption by eliminating the power resulting from operating the clock drivers during each exit from said quiescent state by said data processing, and reducing power consumption associated with transitioning of logic being driven by said clock drivers, such reduction in power consumption being proportional to a frequency of use of said quiescent state by said data processing system.

6. The method of claim 5 further comprising the steps of:

asserting, via said PLL, said first control signal synchronously with said reference clock signal, after said PLL has re-acquired phase-lock, to indicate that said clock state machine may commence generation of a set of clock state signals; and enabling said clock state machine to generate a new clock state enable signal for each of said predetermined number of clock drivers, in response to assertion by said PLL of said first control signal, said new clock state enable signal allowing said predetermined number of clock drivers to transition their respective internal clock signals with said oscillator clock.

7. The method of claim 6 wherein said step of enabling, via said clock state machine, said predetermined number of clock drivers allows said set of internal clock signals, provided to logic within said data processing system, to transition synchronously with said oscillator clock signal only if phase acquisition is complete.

8. The method of claim 6 wherein said step of asserting, via said PLL, said first control signal to indicate that said clock state machine may commence generation of said set of clock state signals enables said predetermined number of clock drivers to generate said set of internal clock signals synchronous to the reference clock signal, in response to generation of said set of clock state signals.

9. In a data processing system having a data processor and a phase-locked loop (PLL) for phase-locking an oscillator clock signal to a reference clock signal provided by an external source, a system for reducing power associated with acquiring phase-lock between said reference clock signal and said oscillator clock signal on or during each exit from a quiescent state by said data processor, said system comprising:

a predetermined number of clock drivers for receiving said oscillator signal from said phase-locked loop (PLL) and for providing a plurality of multi-phase internal clock signal to logic with said data processor, synchronously with said oscillator clock signal; and a clock state machine, coupled to said predetermined number of clock drivers, for receiving a first control signal from said PLL indicating that said PLL is re-acquiring phase-lock as a result of said data processor entering and leaving said quiescent state, and for suppressing a clock state enable signal in response thereto, said clock state machine preventing said predetermined number of clock drivers from changing state synchronously with said oscillator clock signal to suppress transitioning of their respective internal clock signals being distributed to logic within the data processing system, during a period of time when said PLL is re-acquiring phase-lock, said system reducing power consumption by eliminating the power resulting from operating the clock drivers and reducing power consumption due to transitioning of logic being driven by said predetermined number of clock drivers, during each exit from said quiescent state by said data processor, a reduction in power consumption being proportional to a frequency of use of said quiescent state by said data processor.

10. The system of claim 9 wherein said clock state machine enables said predetermined number of clock drivers to generate a set of internal clock signals after said PLL indicates, via assertion of said first control signal, that said PLL has re-acquired phase-lock.

11. The system of claim 9 wherein said clock state machine enables said predetermined number of clock drivers to provide said set of internal clock signals to said data processor, said set of internal clock signals transitioning with said oscillator clock signal only if phase acquisition is complete.

12. The system of claim 9 wherein said clock state machine is enabled via the assertion, by the PLL, of the first control signal synchronous to the reference clock signal, after phase acquisition is complete.

* * * * *